(12) United States Patent
Jung

(10) Patent No.: US 8,003,531 B2
(45) Date of Patent: Aug. 23, 2011

(54) METHOD FOR MANUFACTURING FLASH MEMORY DEVICE

(75) Inventor: Chung-Kyung Jung, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 112 days.

(21) Appl. No.: 12/568,829

(22) Filed: Sep. 29, 2009

(65) Prior Publication Data
US 2010/0105179 A1   Apr. 29, 2010

(30) Foreign Application Priority Data
Oct. 23, 2008  (KR) .......... 10-2008-0104157

(51) Int. Cl.
*H01L 21/44* (2006.01)

(52) U.S. Cl. ........ 438/663; 438/706; 438/745; 438/509; 257/296; 257/E21.006; 257/E21.027; 257/E21.043; 257/E21.077; 257/E21.215; 257/E21.229; 257/E21.245; 257/E21.248; 257/E21.267; 257/E21.278; 257/E21.293; 257/E21.645

(58) Field of Classification Search .......... 438/238, 438/381, 509, 513, 514, 663, 706, 745, 712, 438/954; 257/206, 648, E21.006, 27, 43, 77, 215, 229, 245, 267, 275, 293, 645

See application file for complete search history.

(56) References Cited

U.S. PATENT DOCUMENTS

| | | | |
|---|---|---|---|
| 7,772,676 B2 * | 8/2010 | Han et al. | 257/616 |
| 2005/0214996 A1 * | 9/2005 | Yoshino | 438/197 |
| 2007/0057324 A1 * | 3/2007 | Tews et al. | 257/347 |

* cited by examiner

*Primary Examiner* — David Nhu
(74) *Attorney, Agent, or Firm* — Sherr & Vaughn, PLLC

(57) ABSTRACT

A method for manufacturing a flash memory device is capable of controlling a phenomenon in which a length of the channel between a source and a drain is decreased due to undercut. The method includes forming a gate electrode comprising a floating gate, an ONO film and a control gate using a hard mask pattern over a semiconductor substrate, forming a spacer over the sidewall of the gate electrode, forming an low temperature oxide (LTO) film over the entire surface of the semiconductor substrate including the gate electrode and the spacer, etching the LTO film such that a top portion of the source/drain region and a top portion of the gate electrode are exposed, and removing the LTO film present over the sidewall of the gate electrode by wet-etching.

20 Claims, 3 Drawing Sheets

METHOD FOR MANUFACTURING FLASH MEMORY DEVICE

Figure 1A:
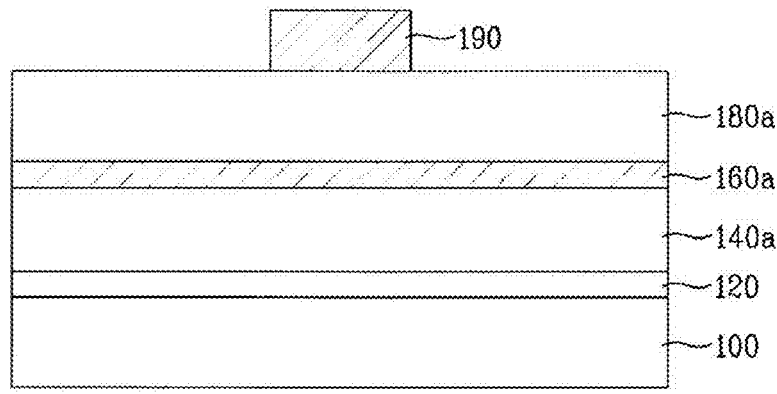

The present application claims priority under 35 U.S.C. 119 to Korean Patent Application No. 10-2008-0104157 (filed on Oct. 23, 2008), which is hereby incorporated by reference in its entirety.

BACKGROUND

A flash memory device has the advantages of erasable programmable read-only memory (EPROM), capable of performing programming and erasing operations, and electrically erasable programmable read-only memory (EEPROM), capable of electrically performing programming and erasing operations. Flash memory devices can realize storage of one bit per transistor, and can electrically program and erase data.

Flash memory is non-volatile, with a laminate structure including a floating gate and a control gate. The floating gate and a control gate are laminated in the form of a conductive polysilicon double-layer over a tunnel oxide film. In a flash memory device, an oxide-nitride-oxide (ONO) structure, acting as an interlayer capacitor dielectric, is interposed between the floating gate and the control gate. A bias is applied from the control gate through the ONO layer to the floating gate depending on coupling ratio. Programming and erasing are controlled by a higher bias.

Hereinafter, a related flash memory device will be described in brief. A first polysilicon layer for a floating gate, an ONO interlayer dielectric, a second polysilicon layer for a control gate and a hard mask film are sequentially deposited over a semiconductor substrate and the resulting structure is etched using a hard mask film pattern to form a gate electrode. Then, high-temperature oxide (HTO) is formed over the entire surface of the semiconductor substrate including the gate electrode. A sidewall nitride film and a sidewall oxide film are sequentially deposited over the HTO. The resulting structure is etched to form an oxide/nitride/oxide (ONO) spacer.

Then, sidewall barrier oxide and sidewall barrier nitride (SBN) are formed as barrier films over the entire surface of the semiconductor substrate including the gate electrode. The sidewall barrier oxide and sidewall barrier nitride present over the gate electrode are removed by dry etching for the subsequent process, i.e., salicide treatment. Then, sidewall barrier oxide and sidewall barrier nitride remaining over the sidewall of the gate electrode are removed by wet etching.

However, this method for manufacturing a related flash memory device requires thermal treatment of sidewall barrier oxide and sidewall barrier nitride at high temperatures, like a process for depositing a hard mask film requiring thermal treatment at high temperatures, thus increasing thermal treatment and significantly increasing the thermal budget. This exposure to heat causes a decrease of the channel between the source and drain and thus increases the probability of leakage current due to shorting.

Also, the general method requires simultaneous removal of sidewall barrier oxide and sidewall barrier nitride by wet etching. This has the disadvantages of adding to the overall process and causing undercut during wet etching.

SUMMARY

Embodiments relate to a method for manufacturing a flash memory device. More specifically, embodiments relate to a method for manufacturing a flash memory device, capable of controlling a phenomenon in which a length of the channel between a source and a drain is decreased due to undercut.

Embodiments relate to a method for manufacturing a flash memory device which includes: forming a gate electrode including a floating gate, an ONO film and a control gate using a hard mask pattern over a semiconductor substrate; forming a spacer over the sidewall of the gate electrode; forming an LTO film over the entire surface of the semiconductor substrate including the gate electrode and the spacer; etching the LTO film such that a top portion of the source/drain region and a top portion of the gate electrode are exposed; and removing the LTO film present over the sidewall of the gate electrode by wet-etching.

Embodiments relate to an apparatus configured to form a gate electrode including a floating gate, an oxide-nitride-oxide film and a control gate using a hard mask pattern over a semiconductor substrate, form a spacer over the sidewall of the gate electrode, form an low temperature oxide film over the entire surface of the semiconductor substrate including the gate electrode and the spacer, etch the low temperature oxide film such that a top portion of the source/drain region and a top portion of the gate electrode are exposed, and remove the low temperature oxide film present over the sidewall of the gate electrode by wet-etching.

DRAWINGS

Figure 1B:
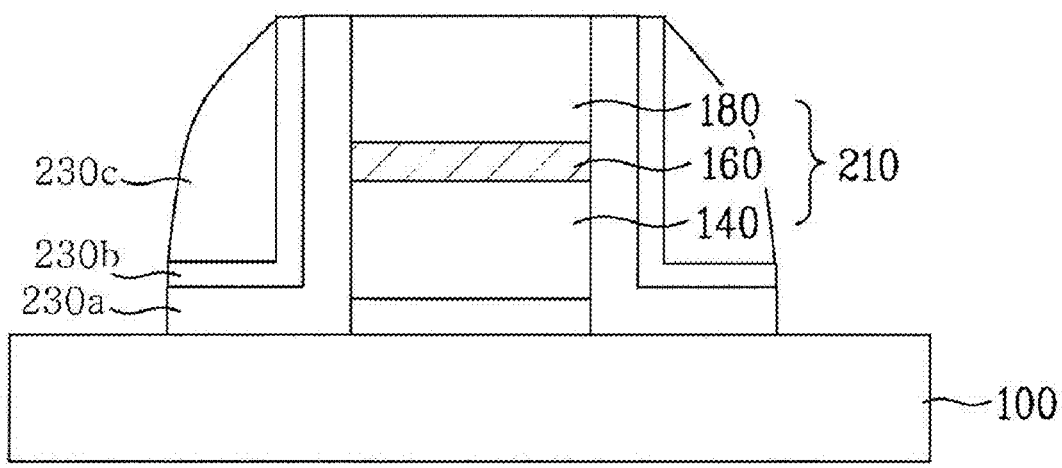
Figure 1C:
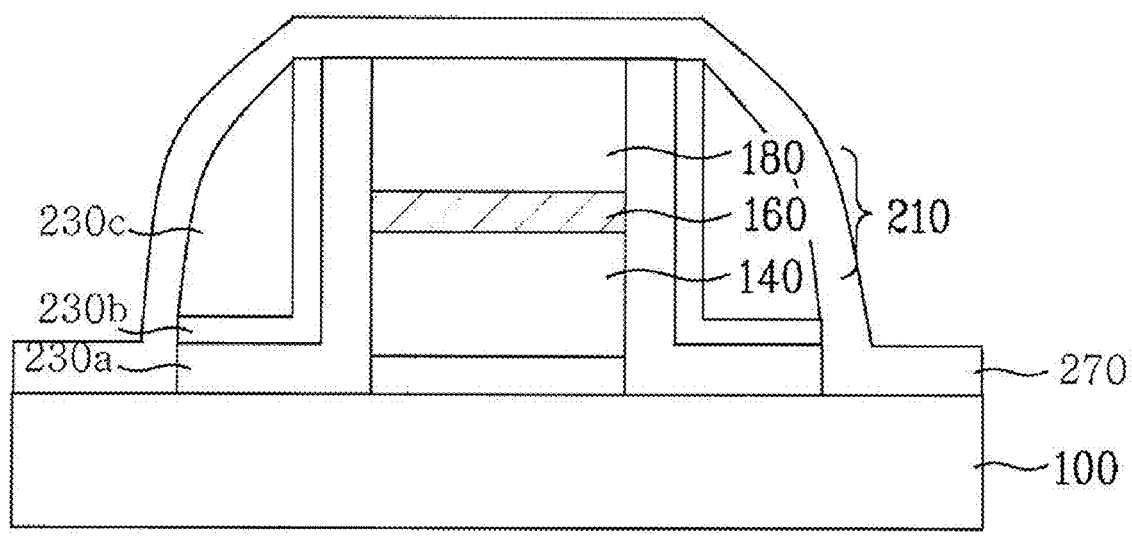

Example FIGS. 1A to 1C are sectional views illustrating a method for manufacturing a flash memory device according to embodiments.

Figure 2:
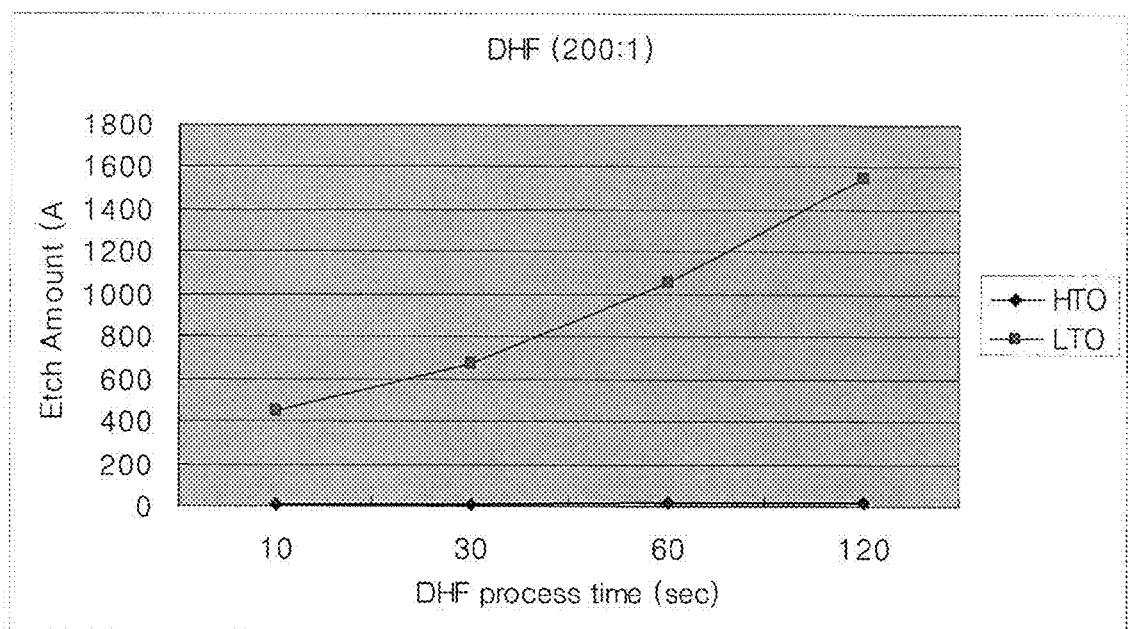

Example FIG. 2 is a graph comparing etching rates of HTO and LTO.

DESCRIPTION

Example FIGS. 1A to 1C are sectional views illustrating a method for manufacturing a flash memory device according to embodiments. First, as shown in example FIG. 1A, to define an active region and a device isolation region, a plurality of device isolation films may be formed over a semiconductor substrate 100 such that the device isolation films are spaced apart from one another by a predetermined distance. In addition, a well may be formed within the substrate in the active region.

Then, a tunnel oxide film 120, a first polysilicon layer 140a for a floating gate, an interlayer dielectric 160a having an oxide/nitride/oxide (ONO) structure and a second polysilicon layer 180a for a control gate may be sequentially deposited in the active region of the semiconductor substrate 100. A mask film including an inorganic material may be deposited over the second polysilicon layer 180a. Then, the inorganic material for the hard mask film may be etched using a photo etching process (PEP) to form a hard mask pattern 190 for forming a gate electrode 210.

Then, as shown in example FIG. 1B, the first polysilicon layer 140a, the interlayer dielectric 160a and the second polysilicon layer 180a may be vertically etched with respect to the device isolation film to a predetermined thickness using the hard mask pattern 190 as a mask, to form a gate electrode 210. The gate electrode 210 includes a floating gate 140, an ONO film 160 and a control gate 180.

Then, a high temperature oxide (HTO) film 230a may be formed over the entire surface of the semiconductor substrate 100 including the gate electrode 210. A sidewall nitride film 230b and a sidewall oxide film 230c may then be sequentially formed. The resulting structure is etched to form a spacer having an oxide/nitride/oxide (ONO) structure.

Then, as shown in example FIG. 1C, a low temperature oxide (LTO) film 270, may be formed over the entire surface of the semiconductor substrate 100 including the gate electrode 210 and the spacer. LTO can be deposited at a temperature (approximately 180 to 220° C.) lower than a temperature of approximately 850° C. or higher at which HTO is deposited. At this time, the LTO film 270 may be formed to a thickness of approximately 100 to 950 Å for approximately 5 to 120 seconds at an $SiH_4$ flow rate of approximately 130 to 1,100 sccm and an $N_2O$ flow rate of approximately 150 to 1,500 sccm.

Then, prior to formation of salicide, a photoresist pattern for non-salicide patterning may be formed by a photo etching process (PEP). The photoresist pattern exposes the top of the source/drain region and the gate electrode 210, i.e., an area in which salicide is formed. In addition, the LTO film 270 corresponding to the top of the source/drain region and gate electrode may be dry-etched by an RIE process using the photoresist pattern.

Then, the LTO film 270 present over the sidewall of the gate electrode 210 may be removed by wet etching. The LTO film 270 may be deposited at approximately 180 to 220° C., and is soft and porous in nature. Accordingly, wet-etching of the LTO film can be carried out within a minimum period even using a low concentration of chemical solution. Damage to the ONO film 160 can be minimized in this process. The LTO film 270 may be removed by wet etching using DHF (approximately 200:1).

Example FIG. 2 is a graph comparing etching rates of HTO and LTO. As shown in example FIG. 2, a related HTO film is deposited at a high temperature, approximately 850° C. or higher. The HTO film is dense, resulting in a low etch rate, as compared to the LTO film. The variations of DHF process time in the case of using DHF (200:1) under these conditions is evaluated. With the LTO, the DHF process time was approximately 10 to 120 sec., causing no damage to the ONO structure. There is significant difference between the etch rate of the LTO film and the related HTO film. It can be confirmed from these results that the use of LTO film minimizes damage to the ONO structure, simplifies a wet etching process to prevent occurrence of undercut, and controls the phenomenon in which a length of the channel between the source and the drain is decreased in the subsequent salicide formation process.

Continuing the flash memory formation process, then, ions may be implanted on the surface of the substrate 100 on both sides of the gate electrode 210 to form a source/drain region. Then, pre-amorphous implantation may be performed on the resulting substrate. Ti/TiN is deposited over the semiconductor substrate 100, and RTP annealing is performed thereon to form a salicide 220 over the surface of the gate electrode 210 and the source/drain region.

In accordance with such a method, it is possible to remove the LTO film 270 in a single step without using SBN and thus to simplify an overall process and decrease occurrence of undercut. As apparent from the fore-going, the method for manufacturing a flash memory device utilizes an LTO film, instead of a nitride film and an oxide film used as barriers in related methods, thus advantageously simplifying wet etching and controlling the phenomenon wherein a length of the channel between the source and the drain is decreased due to undercut.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method for manufacturing a flash memory device, the method comprising:
   forming a gate electrode including a floating gate, an oxide-nitride-oxide film and a control gate using a hard mask pattern over a semiconductor substrate;
   forming a spacer over the sidewall of the gate electrode;
   forming a low temperature oxide (LTO) film over an entire surface of the semiconductor substrate including the gate electrode and the spacer;
   etching the low temperature oxide film such that a top portion of a source/drain region and a top portion of the gate electrode are exposed; and
   removing the low temperature oxide film present over the sidewall of the gate electrode by wet-etching.

2. The method of claim 1, including:
   implanting ions on a surface of the semiconductor substrate on both sides of the gate electrode to form the source/drain region; and
   forming silicide over a surface of the gate electrode and the source/drain region.

3. The method of claim 1, wherein the formation of the spacer over the sidewall of the gate electrode includes:
   sequentially forming an oxide film, a sidewall nitride film and a sidewall oxide film over the entire surface of the semiconductor substrate including the gate electrode; and
   forming an oxide-nitride-oxide structure by an etching process.

4. The method of claim 1, wherein the low temperature oxide film is formed at approximately 180 to 220° C.

5. The method of claim 1, wherein the low temperature oxide film is formed to a thickness of approximately 100 to 950 Å.

6. The method of claim 1, wherein the low temperature oxide film is formed for approximately 5 to 120 seconds at an $SiH_4$ flow rate of approximately 130 to 1,100 sccm and an $N_2O$ flow rate of approximately 150 to 1,500 sccm.

7. The method of claim 2, wherein the formation of the salicide includes:
   performing a pre-amorphous implantation on the semiconductor substrate;
   depositing Ti/TiN over the semiconductor substrate; and
   performing RTP-annealing on the semiconductor substrate.

8. The method of claim 1, wherein the wet-etching of the low temperature oxide film is carried out using DHF at a concentration of approximately 200:1.

9. The method of claim 1, wherein the wet-etching of the low temperature oxide film is carried out for approximately 10 to 120 seconds.

10. The method of claim 1, wherein the etching of the low temperature oxide film to expose a top portion of the source/drain region and a top portion of the gate electrode is carried out using dry-etching.

11. An apparatus configured to:
   form a gate electrode including a floating gate, an oxide-nitride-oxide film and a control gate using a hard mask pattern over a semiconductor substrate;
   form a spacer over the sidewall of the gate electrode;
   form a low temperature oxide (LTO) film over an entire surface of the semiconductor substrate including the gate electrode and the spacer;

etch the low temperature oxide film such that a top portion of a source/drain region and a top portion of the gate electrode are exposed; and remove the low temperature oxide film present over the sidewall of the gate electrode by wet-etching.

12. The apparatus of claim 11, configured to:

implant ions on a surface of the semiconductor substrate on both sides of the gate electrode to form the source/drain region; and form silicide over a surface of the gate electrode and the source/drain region.

13. The apparatus of claim 11 configured to form the spacer over the sidewall of the gate electrode by:

sequentially forming an oxide film, a sidewall nitride film and a sidewall oxide film over the entire surface of the semiconductor substrate including the gate electrode; and forming an oxide-nitride-oxide structure by an etching process.

14. The apparatus of claim 11, configured to form the low temperature oxide film at approximately 180 to 220° C.

15. The apparatus of claim 11, configured to form the low temperature oxide film to a thickness of approximately 100 to 950 Å.

16. The apparatus of claim 11, configured to form the low temperature oxide film for approximately 5 to 120 seconds at an $SiH_4$ flow rate of approximately 130 to 1,100 sccm and an $N_2O$ flow rate of approximately 150 to 1,500 sccm.

17. The apparatus of claim 12, configured to form salicide by:

performing a pre-amorphous implantation on the semiconductor substrate;

depositing Ti/TiN over the semiconductor substrate; and performing RTP-annealing on the semiconductor substrate.

18. The apparatus of claim 11, configured to carry out the wet-etching of the low temperature oxide film using DHF at a concentration of approximately 200:1.

19. The apparatus of claim 11, configured to carry out the wet-etching of the low temperature oxide film for approximately 10 to 120 seconds.

20. The apparatus of claim 11, configured to carry out the wet-etching of the low temperature oxide film to expose a top portion of the source/drain region and a top portion of the gate electrode using dry-etching.

* * * * *